United States Patent
Pesic et al.

(10) Patent No.: US 12,310,037 B2
(45) Date of Patent: May 20, 2025

(54) FERROELECTRIC TUNNEL JUNCTION DEVICES WITH INTERNAL BIASES FOR LONG RETENTION

(71) Applicant: Applied Materials, Inc., Santa Clara, CA (US)

(72) Inventors: Milan Pesic, Paoli, PA (US); Bastien Beltrando, Marseilles (FR)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 17/404,805

(22) Filed: Aug. 17, 2021

(65) Prior Publication Data

US 2023/0054171 A1 Feb. 23, 2023

(51) Int. Cl.
*H10D 1/62* (2025.01)
*H10D 48/00* (2025.01)
(Continued)

(52) U.S. Cl.
CPC ............ *H10D 1/62* (2025.01); *H10D 48/021* (2025.01); *H10D 48/383* (2025.01); *H10D 99/00* (2025.01)

(58) Field of Classification Search
CPC ....... H01L 21/28291; H01L 2924/1441; H01L 27/11502; H01L 27/11585; H01L 27/11597; H01L 29/92; H01L 29/66083; H01L 29/66969; H01L 29/66977; G11C 11/22; G11C 11/221–2297; G11C 17/02; G11C 2213/50; G11C 2213/54; G11C 11/54; G11C 13/0002; H10B 53/00; H10B 53/20; H10B 53/30; H10B 63/00;
(Continued)

(56) References Cited

U.S. PATENT DOCUMENTS

2019/0088664 A1* 3/2019 Kabuyanagi ........ G11C 11/2259
2021/0335799 A1* 10/2021 Lee .......................... H01L 28/40
(Continued)

FOREIGN PATENT DOCUMENTS

CN 106128502 B * 10/2020 ......... G06F 12/0802
KR 20190114919 A * 10/2019 ......... H01L 27/11507

OTHER PUBLICATIONS

He, Electronic device and operation method thereof, Oct. 2, 2020, machine translation of CN 106128502 B, pp. 1-12. (Year: 2020).*
(Continued)

*Primary Examiner* — Natalia A Gondarenko
(74) *Attorney, Agent, or Firm* — Kilpatrick Townsend & Stockton LLP

(57) ABSTRACT

A ferroelectric tunnel junction (FTJ) memory device may include a first electrode and a ferroelectric layer comprising ferroelectric dipoles that may generate a first electric field. The first electric field may be oriented in a first direction when the device operates in an ON state. The device may also include a barrier layer that may generate a depolarizing second electric field that may be oriented in a second direction opposite of the first direction when the device operates in the ON state. The device may further include a second electrode. The first electrode and the second electrode may generate a third electric field that is oriented in the first direction when the device operates in the ON state.

19 Claims, 10 Drawing Sheets

(51) Int. Cl.
*H10D 48/01* (2025.01)
*H10D 99/00* (2025.01)

(58) Field of Classification Search
CPC ........ H10B 63/10; H10B 63/20; H10B 63/22; H10B 43/27; H10B 43/35; H10B 41/27; H10B 41/35; H10D 48/021; H10D 48/383; H10D 99/00; H10D 30/687; H10D 62/058; H10D 62/62; H10D 64/20; H10D 64/60; H10D 64/667
USPC ........................... 257/37, 295, 306, 325, 288
See application file for complete search history.

(56) References Cited

U.S. PATENT DOCUMENTS

2022/0343962 A1* 10/2022 Trantham ............ G11C 11/2297
2022/0352187 A1* 11/2022 Jeon ....................... H10B 53/30
2023/0011305 A1* 1/2023 Chen ................... G11C 11/2273

OTHER PUBLICATIONS

Choi et al., Self-rectifying Ferroelectric Tunnel Junction, 2019, machine translation of KR-20190114919-A, pp. 1-9. (Year: 2019).*

* cited by examiner

FERROELECTRIC TUNNEL JUNCTION DEVICES WITH INTERNAL BIASES FOR LONG RETENTION

TECHNICAL FIELD

This disclosure describes ferroelectric tunnel junction devices that may be used as memory devices with long retention. Specifically, ferroelectric tunnel junction devices include internal biases that oppose the depolarization field of a barrier to stabilize and ON state.

BACKGROUND

Many different types of memory devices may be used to implement the basic components of neural networks and other modern systems. However, a specific family of devices known as ferroelectric devices have not been put into widespread use. A ferroelectric device is a logic/memory device that can maintain its logical/memory state even when power is removed. Ferroelectric devices may be similar to traditional metal oxide silicon (MOS) devices, except that the some of the dielectric material may be replaced with a ferroelectric material. The ferroelectric material may act like a dielectric that "remembers" or stores electric fields to which it has been exposed. In a ferroelectric device, a persistent dipole (or so-called "domain") may be formed within the ferroelectric material itself, thereby representing stable logic states. Because these stable states are persistent, the operation of a device may store state information as is done in a traditional charge-based Flash memory cell. Ferroelectric devices may also use a relatively small amount of power and may be scalable alongside traditional CMOS technologies. The read/write time is faster and the write/erase voltage is lower for ferroelectric devices than for traditional memories such as Flash NAND memory.

BRIEF SUMMARY

In some embodiments, a ferroelectric tunnel junction (FTJ) memory device may include a first electrode and a ferroelectric layer comprising ferroelectric dipoles that may generate a first electric field. The first electric field may be oriented in a first direction when the device operates in an ON state. The device may also include a barrier layer that may generate a depolarizing second electric field that may be oriented in a second direction opposite of the first direction when the device operates in the ON state. The device may further include a second electrode. The first electrode and the second electrode may generate a third electric field that is oriented in the first direction when the device operates in the ON state.

In some embodiments, a method of forming an FTJ memory device may include forming a first electrode and forming a ferroelectric layer including ferroelectric dipoles that may generate a first electric field. The first electric field may be oriented in a first direction when the device operates in an ON state. The method may also include forming a barrier layer that may generate a depolarizing second electric field that may be oriented in a second direction opposite of the first direction when the device operates in the ON state. The method may additionally include forming a second electrode. The first electrode and the second electrode may generate a third electric field that may be oriented in the first direction when the device operates in the ON state.

In some embodiments, a FTJ memory device may include a first electrode, a ferroelectric layer that is between approximately 3.0 nm and 15.0 nm thick, a barrier layer that is between approximately 0.5 nm and 2.0 nm thick, and a second electrode. The first electrode and the second electrode may generate a work function differential of more than approximately 0.50 eV.

In any embodiments, any or all of the following features may be implemented in any combination and without limitation. The ferroelectric layer may be between the first electrode and the barrier layer; and the barrier layer may be between the ferroelectric layer and the second electrode. The first electric field may be oriented in the second direction when the device operates in an OFF state; the second electric field may be oriented in the first direction when the device operates in the OFF state; and the third electric field is oriented in the first direction when the device operates in the OFF state. The first electrode may include a first metal having a first work function; and the second electrode may include a second metal having a second work function. The first work function my be different from the second work function, and a difference between the first work function and the second work function may generate an internal bias creating the third electric field. The first electrode may include a silicon material with a (n−) doping; and the second electrode comprises a silicon material with a (p+) doping, where a difference in doping levels between the first electrode and the second electrode may generate an internal bias creating the third electric field. The barrier layer may be between approximately 0.5 nm and 2.0 nm thick; and the ferroelectric layer may be between approximately 3.0 nm and 15.0 nm thick. The first electrode may be one of a plurality of first electrode layers separated by a plurality of insulator layers in a stack. The ferroelectric layer may include a cylinder that is formed perpendicular to the plurality of first electrode layers and the plurality of insulator layers such that the ferroelectric layer contacts the plurality of first electrode layers. The barrier layer may include a cylinder that is formed adjacent and parallel to the ferroelectric layer to contact the ferroelectric layer. The second electrode may include a cylinder that fills a center of the barrier layer. The method may also include determining a ratio of a thickness of the ferroelectric layer to a thickness of the barrier layer, and determining dielectric constants of the barrier layer and the ferroelectric layer. The method may additionally include accessing results of a simulation that indicates a work function differential based on the thickness ratio, the dielectric constants, and an input ON/OFF ratio. A difference between a work function of the first electrode and a work function of the second electrode may be approximately equal to the work function differential. The method may further include assigning one or more current levels between an ON state and an OFF state as memory states of the FTJ memory device. The method may also include operating the FTJ memory device as a synaptic element in a neural network. The method may additionally include connecting the FTJ memory device to an array of FTJ memory devices in a neural network, where the FTJ memory device may store weights for the neural network.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an FIG. 1A illustrates a ferroelectric tunnel junction (FTJ), according to some embodiments.

DETAILED DESCRIPTION

Solid-state drives (SSDs) representing the majority of modern memory devices may rely on Flash memory technology for their implementations. For example, SSDs may use three-dimensional (3-D) charge-trapping and floating gate NAND technologies. Flash was chosen because of its reliability and its ability to store multiple memory states instead of classical binary 0 and binary 1 states found in 1-bit memories. Multiple memory states has been enabled by the very wide memory window of Flash memory which enables multiple memory states to be "squeezed" into the memory window beyond the traditional binary 0 and 1 states of the 1-bit solutions. Memory technologies that can represent multiple bits of information in a single memory cell are becoming more important in emerging technologies, as they not only increase the storage density, but also reduce the fabrication cost per bit of the memory.

Despite the advantages of using Flash memory, certain technical problems still exist as modern use cases shift to lower-power and faster designs with higher array periphery area-efficiency requirements. Flash memory requires a relatively high voltage of approximately 25 V to program a single bit in the memory cell. Additionally, Flash memory uses relatively long voltage pulses during a programming operation. These pulses may last between 100 μs and a few milliseconds. While these voltage ranges and pulse lengths may be acceptable for long-term storage devices, they are not acceptable for many modern memory applications that require fast, low-power memories. Additionally, circuitry is usually required to provide 25 V signals for the program and erase voltages. For example, charge pumps are required to increase the biasing voltage level up to 25 V. These charge pumps consume area in the cell and result in a lower die utilization as the ratio of memory array to periphery circuits drops. This in turn increases the cost per bit to manufacture the memory array.

To solve the technical problems associated with the speed and voltage requirements presented by Flash memories, the embodiments described herein may use ferroelectric memory elements to implement relatively low-power, high-speed memory devices. The ferroelectric memory elements described herein may use as little as 2 V-4 V when programming individual bits, and the programming pulse lengths may be on the order of approximately 10 ns. Because the ferroelectric dipoles can switch so rapidly and readily using these fast low-voltage pulses, ferroelectric memory elements may be better suited for low-power, high-speed memory applications, such as neural networks and in-memory computing.

Figure 1B:
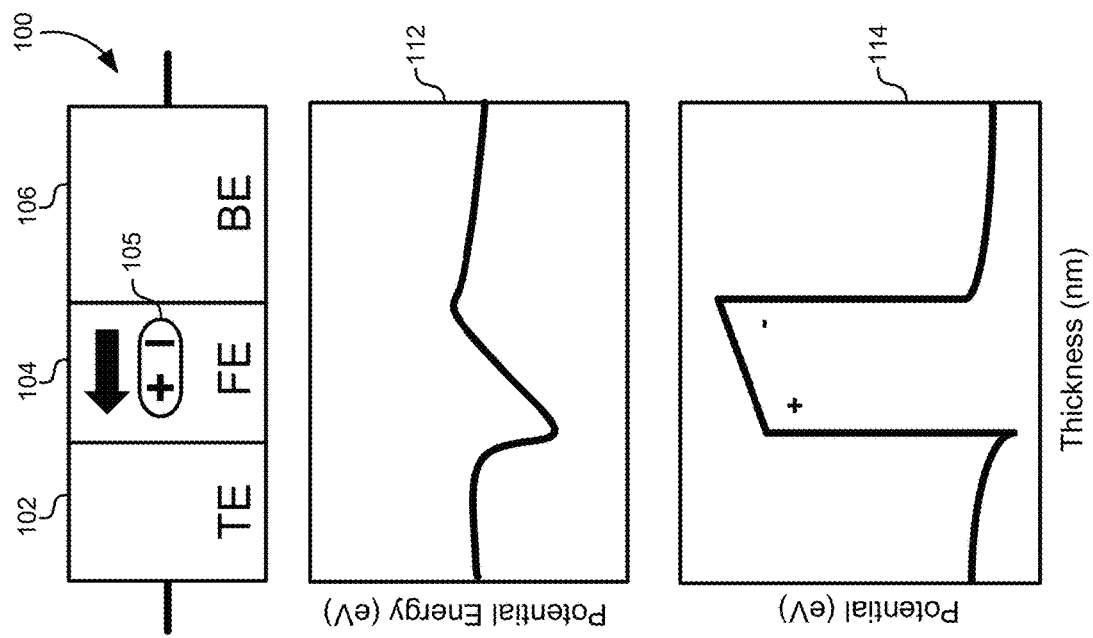
FIG. 1B illustrates an FTJ when the ferroelectric dipoles are oriented in the opposite direction towards the top electrode, according to some embodiments.
Figure 1A:
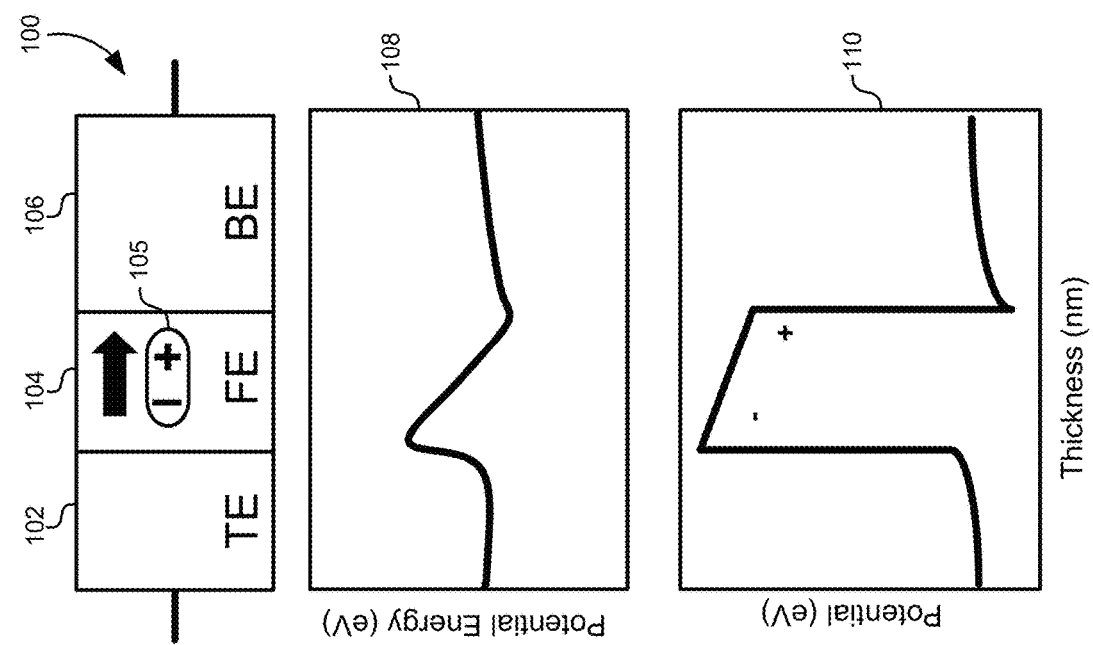

FIG. 1A illustrates a ferroelectric tunnel junction (FTJ) 100, according to some embodiments. The FTJ 100 may include a top electrode 102, a ferroelectric layer 104, and a bottom electrode 106. The ferroelectric layer 104 may be implemented using a ferroelectric material comprising reversible ferroelectric dipoles. The top electrode 102 and the bottom electrode 106 may be fabricated using metal and/or silicon-based materials. The ferroelectric layer 104 may be fabricated using any ferroelectric material, such as an $HfO_2$—$ZrO_2$ mixtures including HfO-rich compositions, HZO, Si, Al, Y, La, N, Z, Gd, Sr, and doped $HfO_x$. Other materials may include Sc:AlN, BFO, lead zirconium titanite/perovskites (PZT), and/or the like.

The orientation of the dipoles may be controlled by an electric field that is applied across the top electrode 102 and the bottom electrode 106. FIG. 1A illustrates the FTJ 100 in a state where the ferroelectric dipoles 105 are oriented with the positive ends of the dipoles 105 towards the bottom electrode 106. By switching the orientation of the ferroelectric dipoles 105, the tunneling barrier of the FTJ can be modulated, resulting in different ON and OFF currents. The difference between these two currents can be used to read the state of FTJ 100 when used as a memory device.

FIG. 1A also illustrates a graph of the potential energy 108 and a graph of the potential 110 across the various layers of the FTJ. As the dipoles 105 in the ferroelectric layer 104 are oriented towards the bottom electrode 106, the normally rectangular-shaped potential 110 of the ferroelectric layer 104 begins to "bend." FIG. 1B illustrates the FTJ 100 when the ferroelectric dipoles 105 are oriented in the opposite direction towards the top electrode 102, according to some embodiments. Note that the "bend" in the potential 114 takes place in the opposite direction when the orientation of the ferroelectric dipoles 105 is reversed. This causes the tunneling distance between the top electrode 102 and the bottom electrode 106 to be different based on the orientation of the ferroelectric dipoles 105 in the ferroelectric layer 104. This difference in the tunneling distance results in different currents that depend on the state of the ferroelectric layer.

This allows the FTJ 100 to store a state as a memory device. To read the memory state of the FTJ 100, the resulting current may be measured.

Despite the speed and low voltage/power operation of the FTJ 100 when used as a memory device, the FTJ 100 does have a number of technical disadvantages compared to other long-term memory devices. For example, the difference between the ON current and the OFF current in the FTJ 100 is very small, meaning that it may be difficult to distinguish between the ON state and the OFF state. The result is a very small ON/OFF current ratio that makes the device susceptible to noise. The memory window of the FTJ 100 is defined as a difference between the ON current and the OFF current at given read voltage. FTJ 100 devices may be used extensively in neural networks to form neural nodes or synaptic devices, which may use a selector and/or memory device for each neural connection. Each of the memory devices in the neural network may include connections to other neural network nodes. While the low-power operation of the FTJ 100 may be ideal for such neural networks in some aspects, the small memory window makes them less useful as candidates to replace traditional memory elements.

Figure 2A:
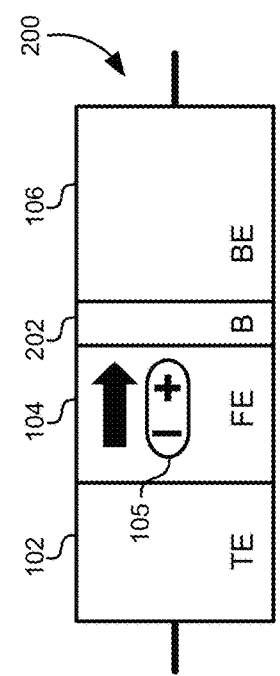
FIG. 2A illustrates an FTJ with a barrier layer added between the ferroelectric layer and the bottom electrode, according to some embodiments.
Figure 2A:
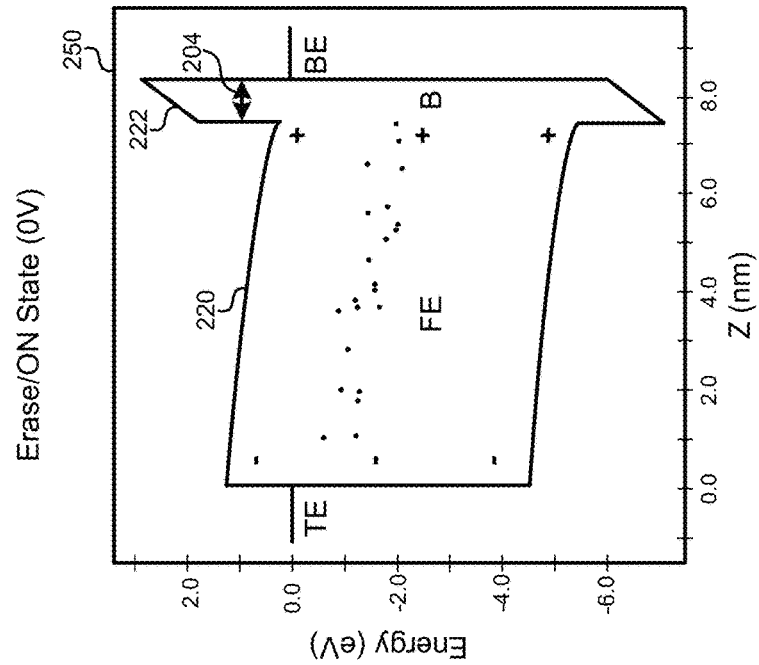

FIG. 2A illustrates an FTJ 200 with a barrier layer 202 added between the ferroelectric layer 104 and the bottom electrode 106, according to some embodiments. In this example, the FTJ 200 again has the ferroelectric dipoles 105 oriented towards the bottom electrode 106. This may be referred to as the "erase state" or "ON state" of the memory device. The barrier layer 202 may be fabricated using any type of oxide, such as $SiO_2$, $Al_2O_3$, $HfO_2$, $ZrO_2$, HfSiO, AlN, and other materials having a relatively high bandgap relative to the ferroelectric layer. FIG. 2A also illustrates a graph 250 of the bandgap energies associated with the different layers in the FTJ 100. Note that the bandgap 222 of the barrier layer 202 is relatively high compared to the bandgap 220 of the ferroelectric layer 104. However, despite the energy differential, the thickness of the barrier layer 202 is relatively small (e.g., approximately 0.5 nm to approximately 2.0 nm). This creates a relatively short tunneling distance 204 when in the ON state. Thus, the current through the FTJ 100 when in the ON state will be relatively high.

Figure 2B:
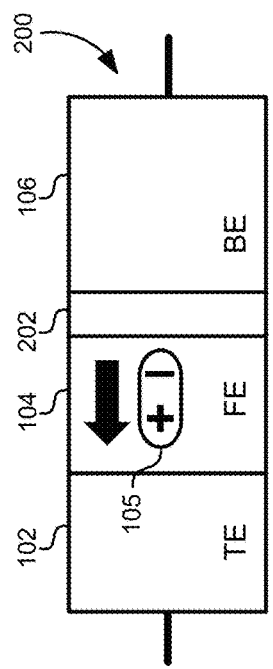
FIG. 2B illustrates the FTJ when the ferroelectric dipoles are oriented towards the top electrode, according to some embodiments.
Figure 2B:
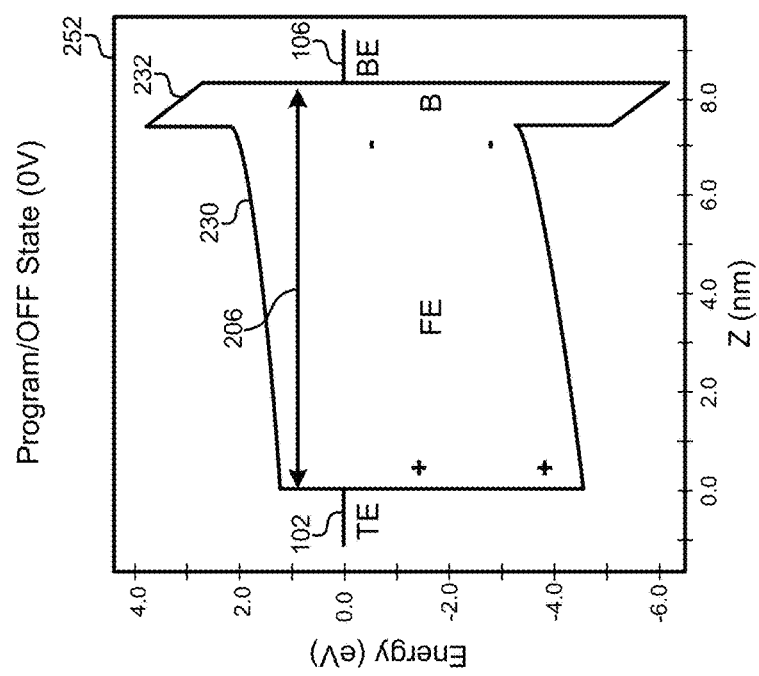

FIG. 2B illustrates the FTJ 200 when the ferroelectric dipoles are oriented towards the top electrode 102, according to some embodiments. This may be referred to as the "program state" or "OFF state" of the memory device. In this state, the bandgap 230 of the ferroelectric layer 104 bends up towards the bottom electrode 106. This causes the tunneling distance 206 to travel through the bandgap 230 of the ferroelectric layer 104 and the bandgap 232 of the barrier layer 202. This causes the current to be very low when in the OFF state compared to the current in the ON state. Thus, adding the barrier layer 202 may increase the ON/OFF ratio and the width of the resulting memory window to a more acceptable operating range for many applications.

However, despite the widening of the memory window resulting from the use of the barrier layer 202, the barrier layer 202 itself also produces some negative side effects in the operation of the FTJ 200. Specifically the additional layer added in series next to the ferroelectric layer 104 causes an electric field to form that opposes the electric field formed by the ferroelectric dipoles 105 in the ferroelectric layer 104. This counteracting electric field formed in the barrier layer 202 reduces the effect of the electric field formed by the ferroelectric layer 104. The barrier layer 202 may thus be referred to as a "dead layer" for its effect on the electric field in the FTJ 200. The electric field formed by the barrier layer may be referred to as a depolarization field, as it counteracts the effect of the polarization field in the ferroelectric layer.

Figure 3:
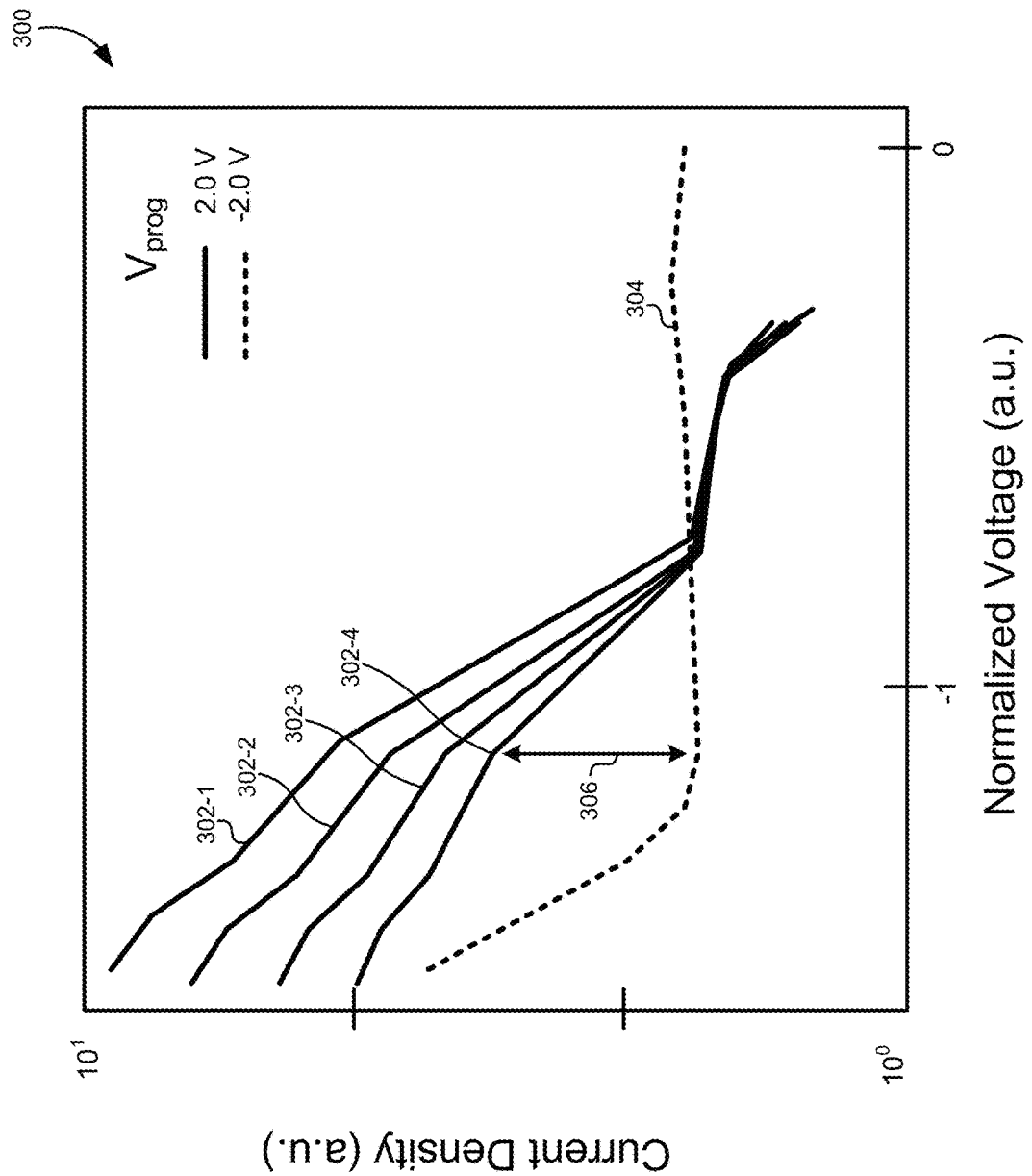
FIG. 3 illustrates a graph of the ON current and the OFF current in an FTJ as the device is read repeatedly over time, according to some embodiments.

FIG. 3 illustrates a graph 300 of the ON current and the OFF current in an FTJ as the device is read repeatedly over time, according to some embodiments. The a plurality of lines representing ON currents 302 in the graph 300 are displayed to represent various ON current levels as the device is read over time. The graph 300 assumes that the FTJ is programmed into the ON state and then read repeatedly over time. For example, current 302-1 may represent an initial current level when the device is programmed. Notice that the memory window 306 is relatively large between the ON current 302-1 and the OFF current 304 when the device is initially programmed. However, as the device is repeatedly read over time, the ON currents 302 read from the device may gradually decrease. For example, after a certain number of reads or after a certain time interval, the ON current 302-1 may gradually decrease to be around current 302-2, then down to current 302-3, and so forth.

The current density represented on the y-axis is relatively high for the ON currents 302 soon after the device is programmed. Specifically, the memory window 306 between the ON current 302-1 and the OFF current 304 is relatively large when the device is initially programmed. However, as the device is repeatedly read over time and/or the device ages. The memory window 306 gradually shrinks due to the effect of the depolarization field described above. This reduces the retention of the FTJ, which may be of concern when used as a memory device for long time intervals (e.g., up to 10 years). Therefore, although the barrier layer may be initially effective in increasing the memory window, it tends to destroy the retention of the FTJ when used as a long-term memory.

To solve this problem of maintaining a large ON/OFF ratio in the FJT while minimizing the effect of the depolarization field, some embodiments may utilize work function engineering to introduce an internal bias and stabilize the ON state at the expense of the OFF state. As illustrated above in FIGS. 2A-2B, the OFF current is dominated by a trap-assisted tunneling current. The majority of the current flows by electron "hopping" through the wide bandgap of the ferroelectric layer. Therefore, the ferroelectric switching has only a minimal impact on the OFF current. In other words, the tunneling distance is very large in the OFF state regardless of the ferroelectric switching. In contrast, the ferroelectric switching causes a significant current jump in the ON current due to the preferential tunneling path through the barrier layer as the energy band bends. In order to maintain the longer tunneling distance, some embodiments introduce a work function offset between the top and bottom electrodes to increase the tunneling distance.

Instead of using the same material for the top and bottom electrodes as is done in existing devices, different metal electrodes may be used along with polysilicon, silicon, germanium, IGZO, and other materials. By selecting different materials for the top electrode and the bottom electrode, the work function differential between these electrodes can be tailored to stabilize the retention of the ON state at the expense of sacrificing retention of the OFF state. This is possible because it is been discovered that ferroelectric switching in the OFF state has only a negligible impact on the ON/OFF ratio and memory window of the device as a whole. Specifically, even without ferroelectric switching, the current in the OFF state would be the same. Conversely, the ferroelectric switching when in the ON state causes significant jumps in the current due to the preferential tunneling path through the barrier layer. Using different materials or materials with different doping levels for the electrodes to generate an engineered work function and internal bias maintains the large ON/OFF ratio while dramatically improving the retention of the device as a memory. Specifically, the internal bias generated by the work function differential between the top and bottom electrodes stabilizes the ON state.

One benefit of preserving and increasing the memory window is that this creates the opportunity to use the FTJ as a multi-state memory having three or more memory states (e.g., one or more current levels between the ON state and the OFF state). As the memory window widens, multiple current states may be realized between the full ON state and the OFF state. For example, in FIG. 3, each of the currents 302 may represent a separate and distinct state of the FTJ memory device. Since the memory window is stable and the retention of device does not degrade over time, these different states can be reliably read/written and differentiated throughout the life cycle of the device.

Figure 4B:
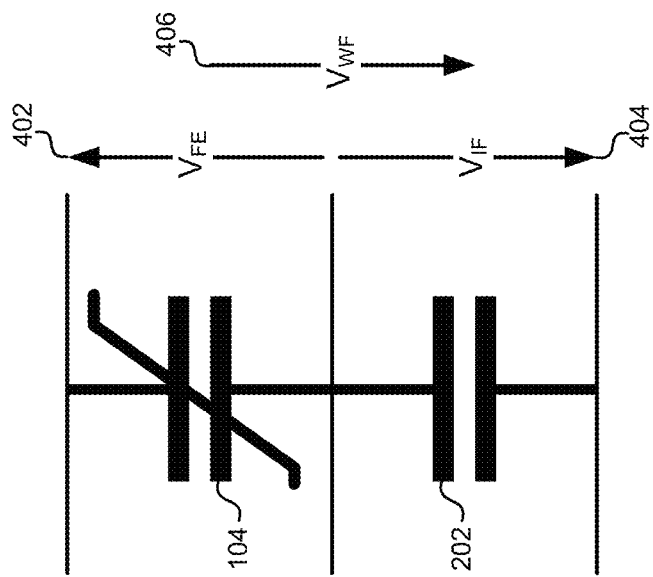
FIG. 4B illustrates a simplified circuit diagram representing the ferroelectric layer with polarization directions in the OFF state and the barrier layer as capacitors storing electric fields, according to some embodiments.
Figure 4A:
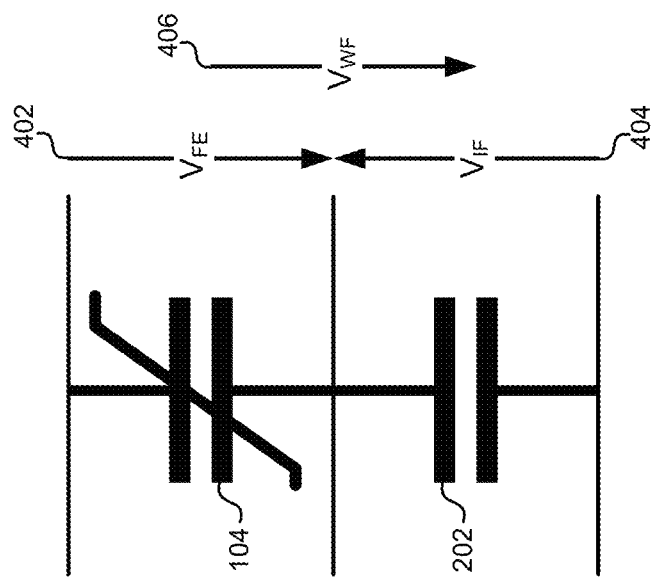
FIG. 4A illustrates a simplified circuit diagram representing the ferroelectric layer with polarization directions in the ON state and the barrier layer as capacitors storing electric fields, according to some embodiments.

FIG. 4A illustrates a simplified circuit diagram representing the ferroelectric layer 104 and the barrier layer 202 as capacitors storing electric fields in the ON state, according to some embodiments. The depolarizing electric field 404 formed in the barrier layer 202 opposes the electric field 402 formed in the ferroelectric layer 104 such that the coercive electric field ($E_c$) through the device is decreased. Therefore, the retention is determined by $E_{dep}/E_c<1$, where the depolarization field is given by equation (1) below.

$$E_{dep} = \frac{P_r}{k_{FE}\varepsilon_0}\left(1 + \frac{k_{IF}d_{FE}}{k_{FE}d_{IF}}\right)^{-1} \quad (1)$$

In this equation, $E_{dep}$ represents the depolarizing electric field generated by barrier layer, $P_r$ represents the remnant polarization, $k_{IF}$ and $k_{FE}$ represent the dielectric permittivity of the barrier layer and the ferroelectric layer, respectively, $\varepsilon_0$ represents the vacuum permittivity, and $d_{IF}$ and $d_{FE}$ represent the thickness of the barrier layer and the ferroelectric layer, respectively.

When different materials are used for the top electrode and the bottom electrode, an inherent work function differential is generated between the top electrode and the bottom electrode. In some embodiments, a work function differential of more than approximately 0.50 eV between the top electrode and the bottom electrode may be used. For example, the bottom electrode may have a work function of approximately 4.2 eV, and the top electrode may have a work function of approximately 4.75 eV. This device may use a layer stack comprised of (first metal top electrode)/(ferroelectric layer layer)/(barrier layer)/(second metal bottom electrode). This work function differential may generate an electric field 406 that will be formed in the same direction as the electric field 402 resulting from the ferroelectric layer 104 in the ON state. Thus, the electric field 406 resulting from the work function differential can be configured to substantially cancel the effect of the depolarizing electric field 404 resulting from the barrier layer 202 in this state. The electric field 406 and the electric field 402 may be referred to as being oriented in a first direction, and the electric field 404 may be referred to as being oriented in a second direction that is opposite of the first direction in the ON state.

FIG. 4B illustrates a simplified circuit diagram representing the ferroelectric layer 104 in the OFF state, according to some embodiments. As the ferroelectric dipoles in the ferroelectric layer 104 are reversed, the direction of the electric field 402 from the ferroelectric layer is also reversed. Consequently, the direction of the depolarizing electric field 404 induced in the barrier layer 202 is also reversed. However, the electric field 406 from the work function differential remains in the same direction. This will tend to reinforce the depolarizing electric field 404 and could degrade the retention of the FTJ in the OFF state. However as described above, the shape of the energy band diagram and the barrier layer causes the current to remain very small. Thus, these embodiments can sacrifice the retention and destabilize the OFF state illustrated in FIG. 4B in order to reinforce the retention of the device and stabilize the state while in the ON state of FIG. 4A. The current will always be low in the OFF state, so this destabilization can be disregarded. The electric field 404 and the electric field 406 may be referred to as being oriented in a first direction, and the electric field 402 may be referred to as being oriented in a second direction that is opposite of the first direction in the OFF state.

Figure 5:
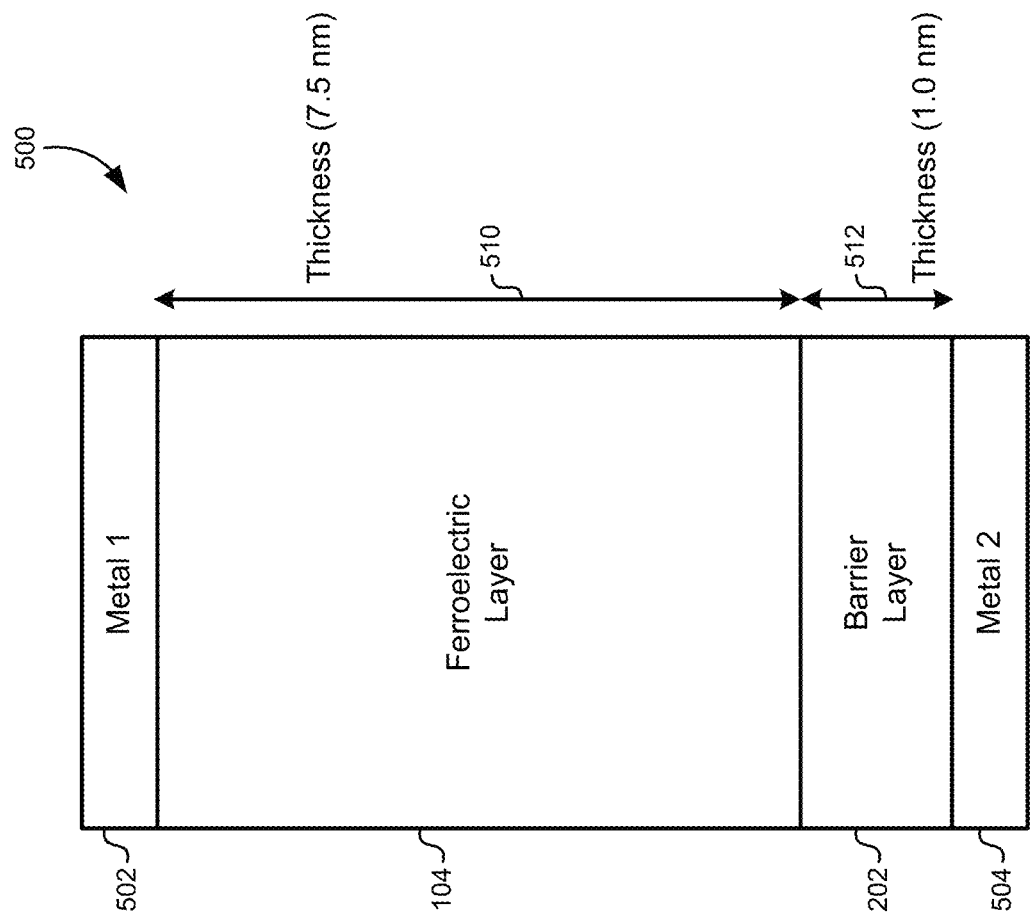
FIG. 5 illustrates an FTJ with an internal bias generated by metal electrodes having a different work functions, according to some embodiments.

FIG. 5 illustrates an FTJ 500 with an internal bias generated by metal electrodes having a different work functions, according to some embodiments. The FTJ 500 may include a first electrode 502 implemented using a first metal layer. The first electrode 502 may use a metal having a relatively lower work function compared to metal choices used in an opposite electrode. For example, some embodiments may implement the first electrode 502 using metals such as TiAlN, Al, and other materials having similar work functions lower than approximately 4.5 eV. The first electrode 502 may be deposited as a metal layer on a semiconductor wafer.

The FTJ 500 may also include a ferroelectric layer 104 implemented using the materials described above. The thickness of the ferroelectric layer may typically be between 3.0 nm and 15 nm. In this example, the thickness is approximately 7.5 nm. Varying thicknesses may be used, but note that the thickness of the ferroelectric layer 104 will influence the work function differential that needs to be generated in the FTJ 500 since the internal electric field is a function of the thickness of the device (i.e., the distance covered by the electric field).

The FTJ 500 may also include a barrier layer 202 using the materials described above. The thickness of the barrier layer 202 may typically be between 0.5 nm and 2.0 nm. The thickness in this example is approximately 1.0 nm. Again, the thickness of the barrier layer 202 may influence the work function differential between the electrodes as described in detail below.

The FTJ 500 may also include a second electrode 504 implemented using a second metal layer. The second electrode 504 may use a metal having a relatively higher function compared to the metal choices used in the first electrode 502. For example, the second electrode 504 may be implemented using metals such as TiN, TaN, Pd, Pt, W, and other metals having similar work functions greater than approximately 4.5 eV. Like the other layers in the FTJ 500, the layer of the second electrode 504 may be deposited as a layer on top of the proceeding layers in the stack in a semiconductor device/wafer.

Figure 6:
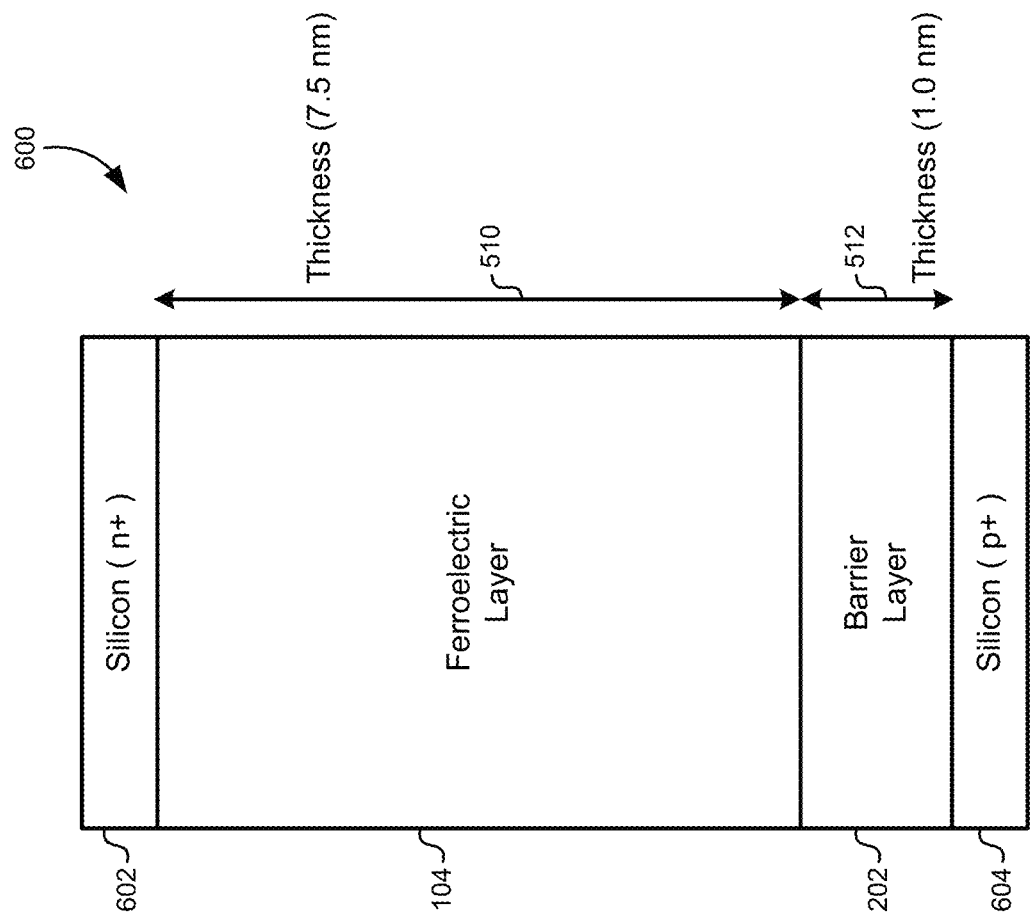
FIG. 6 illustrates an FTJ with an internal bias generated by silicon electrodes having a different doping levels to generate an internal bias, according to some embodiments.

FIG. 6 illustrates an FTJ 600 with an internal bias generated by silicon electrodes having a different doping levels to generate an internal bias, according to some embodiments. The internal bias generated by the doped silicon may generate an electric field similar to the electric field generated by the work function differentials of the different metals described above in FIG. 5. Specifically, silicon-based electrodes may be used, and the silicon doping of the electrodes may be controlled to generate the desired work function differential. For example, doping of the silicon may adjust the Fermi level of the semiconductor, which can be finely tuned to generate the work function differential. Specifically, n-type doping may generate a work function down to 4.05 eV, and p-type doping may generate a work function of up to approximately 5.1 eV. The doping level may be used to specifically control the differential between the two electrodes and tune the memory window of the device.

The FTJ 600 may include a first electrode 602 comprised of (n+) highly doped silicon. As described above in FIG. 5, the FTJ 600 may also include a ferroelectric layer 104 and a barrier layer 202 using the thicknesses and materials described above. A second electrode 604 may be comprised of (p+) doped silicon. The silicon electrodes 602, 604 may be doped using standard n/p doping techniques known in the art. However, the level of doping may be selected in order to generate a specified electric field strength between the first electrode 602 and the second electrode 604.

Figure 7:
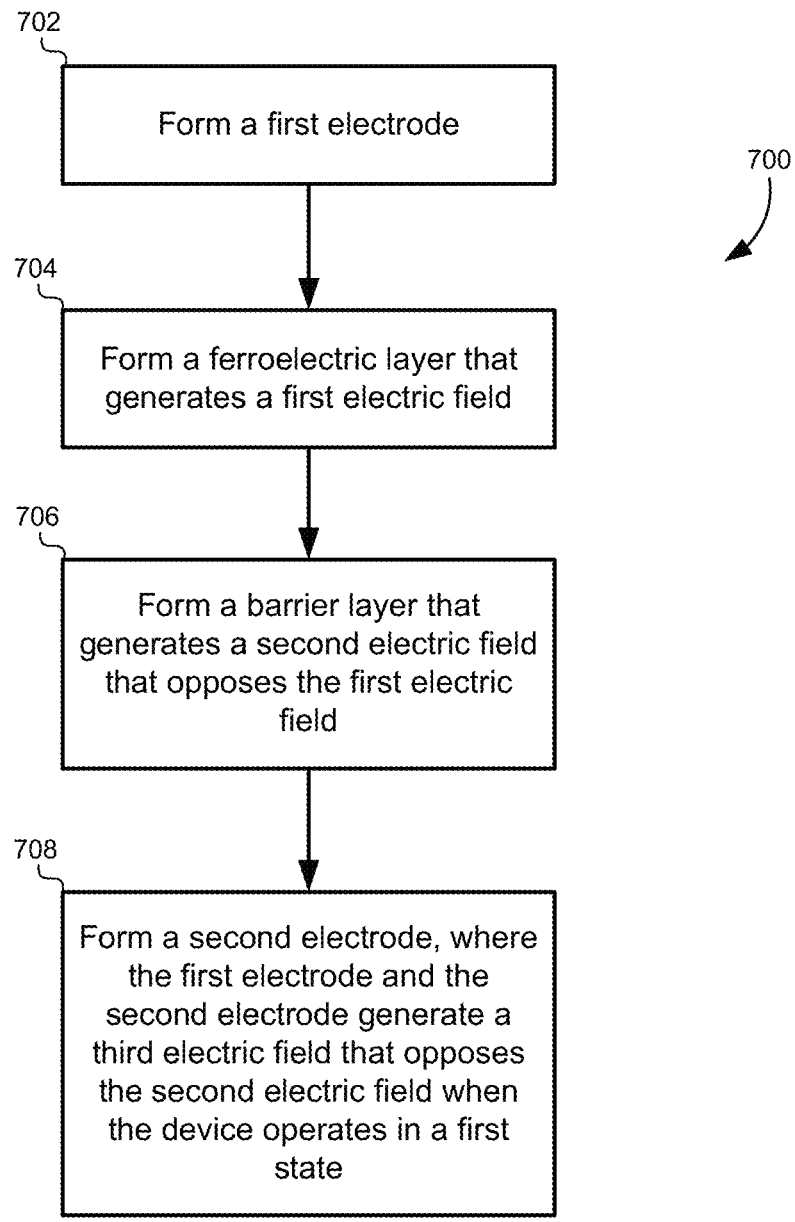
FIG. 7 illustrates a flowchart of a method for fabricating an FTJ with long retention, according to some embodiments.

FIG. 7 illustrates a flowchart 700 of a method for fabricating an FTJ with long retention, according to some embodiments. The method may be carried out using semiconductor processing chambers, such as etch chambers, deposition chambers, polishing chambers, and/or other equipment that is commercially available, such as the equipment available from Applied Materials®. The various layers may be applied using any techniques known in the art, such as sputtering, chemical deposition, plasma vapor deposition, and so forth.

The method may include forming a first electrode (702). In some embodiments, the first electrode may comprise a first metal having a first work function. In other embodiments, the first electrode may comprise a silicon material or any other semiconducting material, such as but not limited to oxide semiconductors, that is doped to be a layer of n-doped silicon or a layer of p-doped silicon.

The method may also include forming a ferroelectric layer that generates a first electric field (704). The first electric field may be generated by ferroelectric dipoles in the ferroelectric layer that are oriented based on a voltage applied to the FTJ device. The orientation of the electric field may thus be determined based on the orientation of the ferroelectric dipoles in the ferroelectric layer. The ferroelectric layer may be between 3.0 nm and 15.0 nm thick and may be manufactured from any of the materials described above.

The method may additionally include forming a barrier layer that generate a second electric field (706). The second electric field may be oriented in an opposite direction as the first electric field such that the second electric field opposes the first electric field. For example, when the ferroelectric dipoles are oriented towards the first electrode, the first electric field may be oriented towards the first electrode and the second electric field may be oriented in a direction opposite of the first electrode (e.g., towards the second electrode). The second electric field may be a depolarizing electric field that is induced in the barrier layer by the electric field formed by the ferroelectric dipoles. The barrier layer may be between approximately 0.5 nm and 2.0 nm thick. The barrier layer may have a relatively low dielectric constant in comparison to a dielectric constant of the ferroelectric layer. For example, the ferroelectric layer may have a dielectric constant that is at least 1.5 times the dielectric constant of the barrier layer. Consequently, the barrier layer may have a larger bandgap than the ferroelectric layer.

The method may further include forming a second electrode (708). The first electrode and the second electrode may generate an internal bias that forms a third electric field in the FTJ. In some embodiments, the FTJ may operate in a plurality of states. For example, the FTJ may operate in an ON state (first state) or in an OFF state (second state) as described above. When operating the ON state, the third electric field may oppose the second electric field by being oriented in the opposite direction. For example, the internal electric field generated by the work function differential or doping difference between the first electrode and the second electrode may form a third electric field that is oriented in the same direction as the first electric field formed by the ferroelectric layer, and oriented in the opposite direction of the second electric field formed by the barrier layer. Conversely, when operating in the OFF state, the third electric field may oppose the first electric field and be oriented in a same direction as the second electric field. However, because the current will already be minimized in the OFF state, the effect of the third electric field need not affect the retention of the FTJ when used as a memory device.

It should be appreciated that the specific steps illustrated in FIG. 7 provide particular methods of fabricating a FTJ device according to various embodiments. Other sequences of steps may also be performed according to alternative embodiments. For example, alternative embodiments may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications. Many variations, modifications, and alternatives also fall within the scope of this disclosure.

Figure 8:
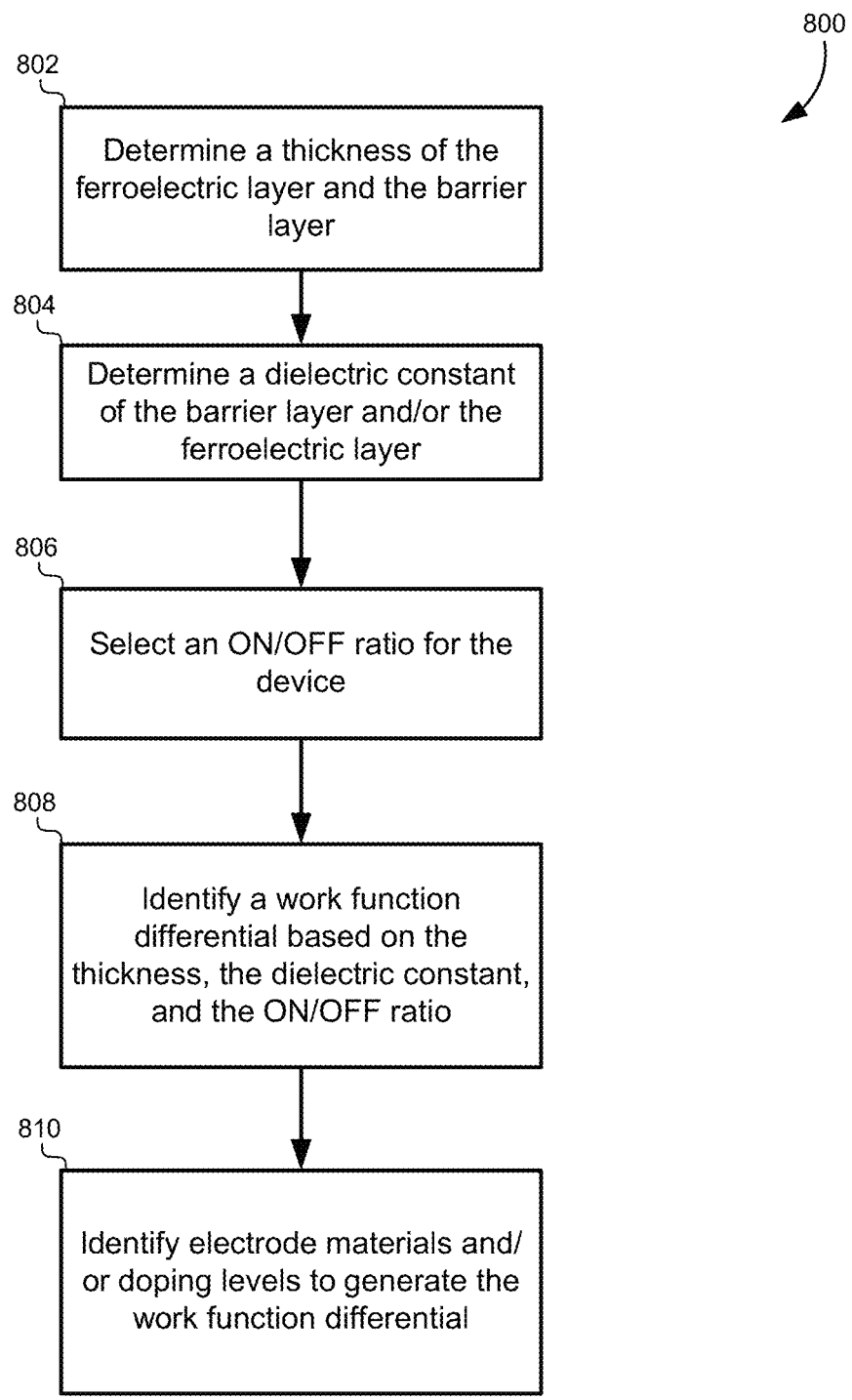
FIG. 8 illustrates a flowchart of a method for identifying materials or doping levels for the first electrode and the second electrode, according to some embodiments.

FIG. 8 illustrates a flowchart 800 of a method for identifying materials or doping levels for the first electrode and the second electrode, according to some embodiments. This method may be carried out automatically by a computing system when designing the FTJ. For example, a non-transitory computer-readable medium may store instructions that cause one or more processors to execute operations as described below. These instructions may be part of a simulation software package or other circuit design software program. A computer system comprising one or more processors and one or more memory devices storing such instructions may also carry out these operations.

The method may include determining a thickness of the ferroelectric layer and/or the barrier layer (802). Designing the FTJ may begin by selecting or measuring a thickness of the ferroelectric layer and/or a thickness of the barrier layer. For example, as a starting point, the process may receive materials to be used for the ferroelectric layer and the barrier layer, along with thicknesses of each of these layers. The method may then be used to identify a work function difference in eV that should be applied across the electrodes in order to counter the effects of the depolarizing field and produce a device with stable memory retention. Determining a thickness may include determining a ratio of the thickness of the ferroelectric layer to the thickness of the barrier layer.

The method may also include determining a dielectric constant of the barrier layer (804). The dielectric constant of the barrier layer may affect the capacitance of that layer. In turn, this may affect the strength of the depolarizing electric field generated by the barrier layer. The dielectric constant may be determined based on the materials chosen for the barrier layer, and may be received as an input to the process. Note that the dielectric constant of the ferroelectric layer may also affect the depolarization field (as shown in equation (1) above). As illustrated in FIGS. 4A-4B, the electric field across the device may be split by a voltage divider circuit formed by the two capacitors representing the ferroelectric layer and the barrier layer. Therefore, determining the dielectric constant may include receiving a selection of a material and looking up a predetermined dielectric constant based on this material. Determining the dielectric constant may also include tuning the voltage divider based on the capacitance illustrated in FIGS. 4A-4B between the barrier layer and the ferroelectric layer in order to satisfy equation (1) described above and balance the depolarizing electric field with the other electric fields in the device. This may include selecting a barrier material such that it's dielectric constant minimizes the depolarization field according to equation (1). Some embodiments may also determine a dielectric constant for the ferroelectric layer. For example, a ratio between the dielectric constants of the barrier layer and the ferroelectric layer may be determined and used in equation (1) above.

The method may additionally include selecting a desired ON/OFF ratio for the FTJ device (806). This ratio may be selected based on the particular needs of the application for which the FTJ will be used. Typical values for the ON/OFF ratio may range from between approximately $10^{-1}$ and $10^{10}$. For example, applications using the FTJ as a multi-state memory with multiple current levels representing different stored memory states may require a larger ON/OFF ratio than other applications. This ratio may be received as an input to the process.

Figure 9:
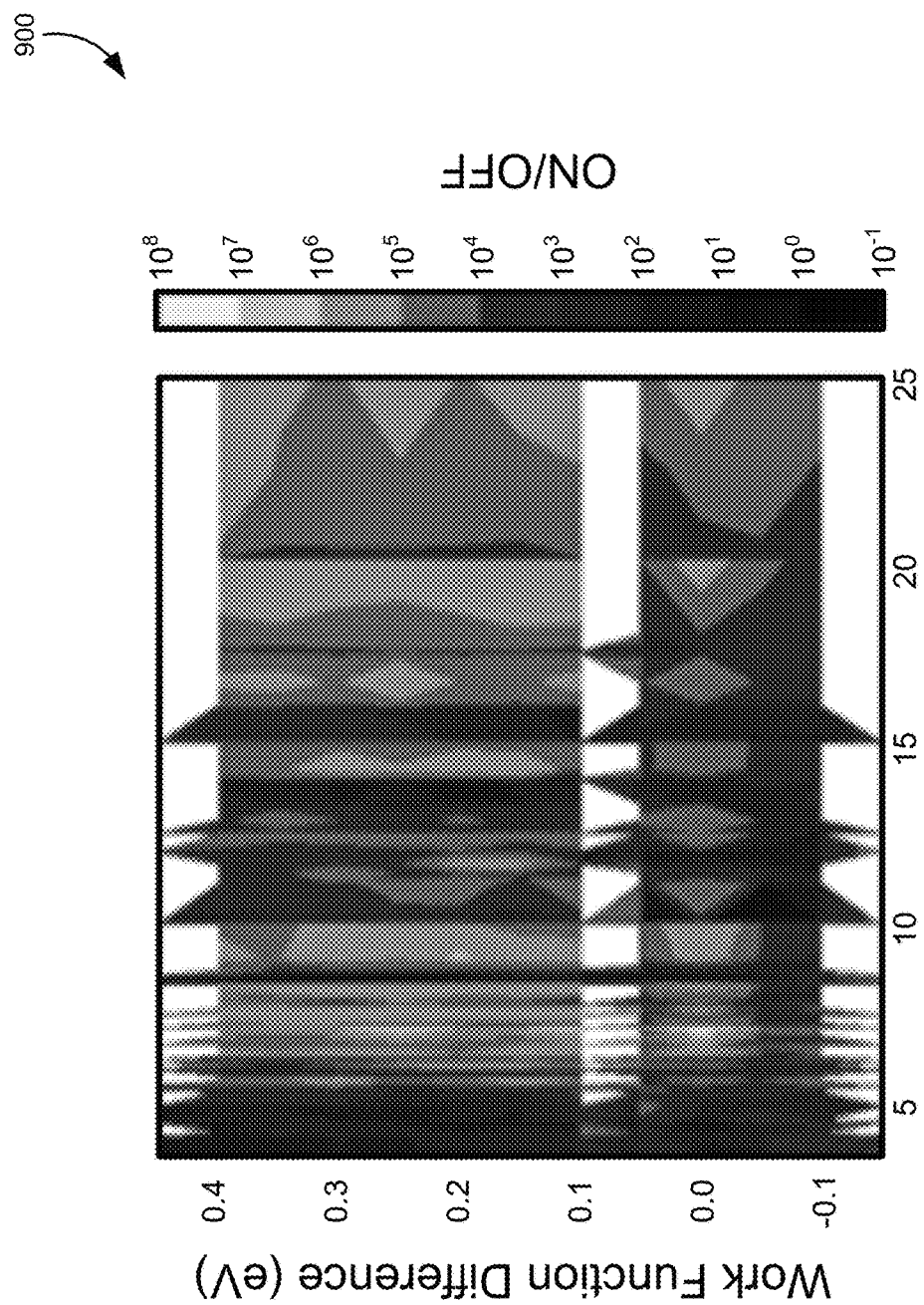
FIG. 9 illustrates a graph of simulation results with an input thickness ratio and an output work function differential, according to some embodiments.

The method may further include identifying a work function differential based on the thickness, the dielectric constants/materials, and the ON/OFF ratio (808). Using these values as inputs, the work function differentials for various operating conditions may be determined through a simulation. FIG. 9 illustrates a graph 900 of simulation results that input the thickness ratio along the bottom x-axis and output the work function differential on the y-axis. The colors or patterns displayed in the graph 900 indicate the different ON/OFF ratios at each point as a third dimension in the graph 900. To use the graph 900, a user or the software process may identify the lighter areas on the graph 900 indicating work function differentials that will generate the highest ON/OFF ratios at a given thickness ratio. The point on the y-axis may then be used to identify the required work function differential to produce that ON/OFF ratio.

The graph 900 in FIG. 9 illustrates one example of simulated results generated for specific materials used for the ferroelectric layer and the barrier layer, along with a known dielectric constants of the ferroelectric and the barrier layer. Graphs similar to graph 900 may be generated using standard simulation techniques for different materials and/or different dielectric constants. The circuit design process may then access the graph or simulation results corresponding to the particular materials and/or dielectric constants of the current FTJ being designed. The process may then use the method of flowchart 800 to determine the particular work function differential. The data from these graphs may be stored as simulation results, and the simulation results may be accessed by the process to select materials for use as the first electrode and/or the second electrode.

Turning back to FIG. 8, the method may also include identifying electrode materials and/or doping levels to generate the work function differential (810). Work function values of different metals are readily accessible in reference materials that are commonly available. The process may then select metals having work functions that generate the calculated work function differential. Alternatively, doping levels may be selected that will produce the corresponding work function differential. Specifically, these materials may be chosen such that a work function of the first electrode and a work function of the second electrode is approximately equal to (or in some embodiments, in the ranges defined as in FIG. 9) the work function differential indicated by the simulated results. For example, using the principle that heavy p+ doping may correspond to an effective work function of about 5.1 eV, and heavy n+ doping may correspond to an effective work function of about 4.01 eV, the precise tuning of the concentration of both electrodes may be used to engineer the desired difference.

Figure 10:
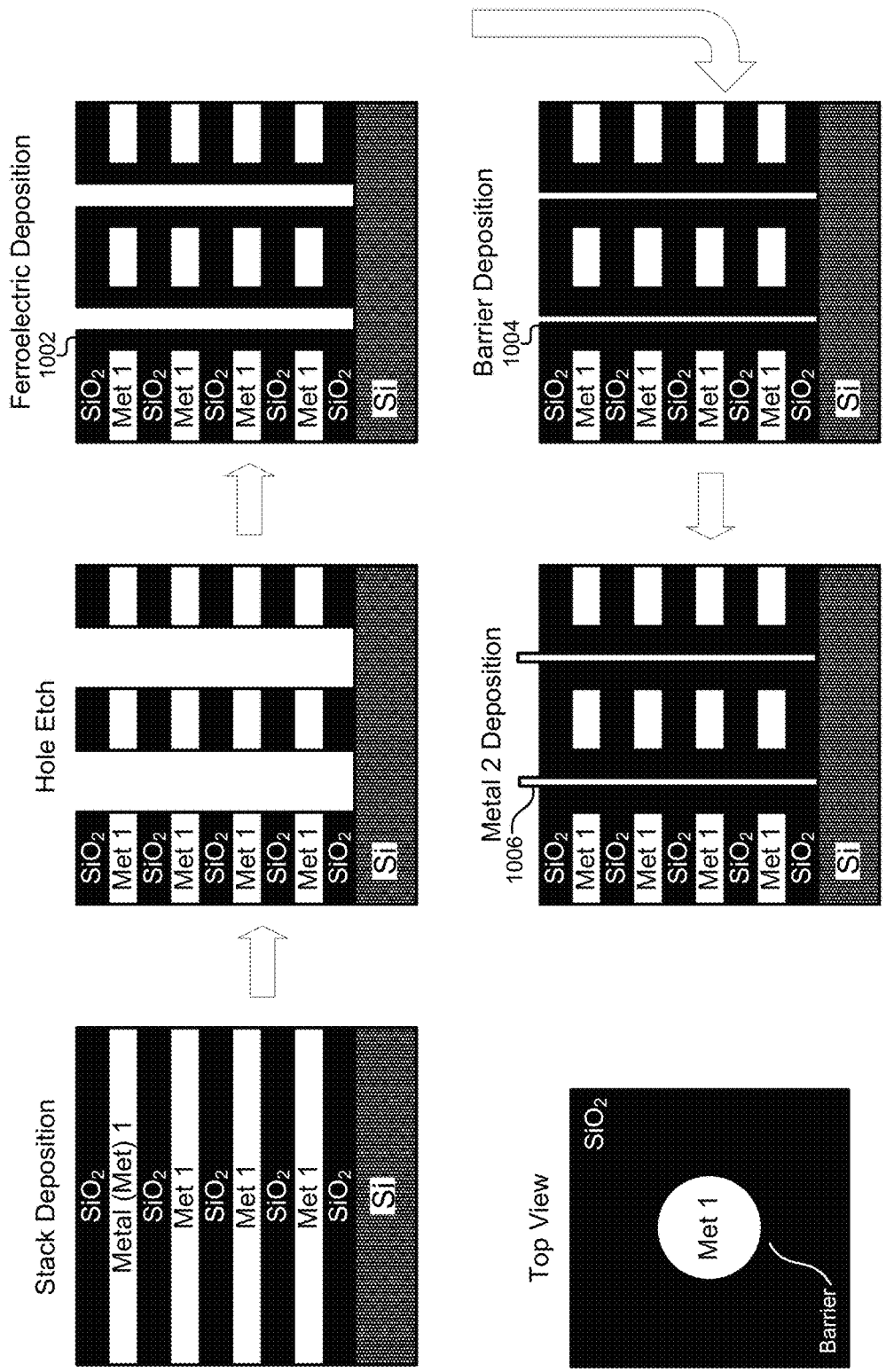
FIG. 10 illustrates a simplified method of fabricating an array of vertical memory cells, according to some embodiments.

FIG. 10 illustrates a simplified method of fabricating an array of vertical memory cells, according to some embodiments. First, a stacked deposition step may deposit alternating layers of an insulator and a material for one of the two electrodes. In this example, silicon dioxide is used as an insulator, and a metal such as TiN may be used as the electrode material. Each of the Metal 1 layers may be considered a first/top electrode, and the plurality of first electrodes may be separated by the insulator layers. Next, holes may be etched in one of the rows of alternating electrode and isolator layers. Because this is a cross-sectional view, holes in this step may appear to extend all the way through each of the alternating metal and isolator layers. However, it should be understood that this cross-sectional view represents vertical holes as illustrated in the top view bottom left-hand corner of FIG. 10.

Next, each of the holes may first be filled with a ferroelectric layer 1002 using a deposition process. The ferroelectric layer 1002 may be deposited as a cylinder that is perpendicular to the electrode layers and/or the insulator layers such that the ferroelectric material contacts each of the Metal 1 layers. Then, a barrier layer 1004 may be deposited on the ferroelectric layer 1002. The barrier layer 1004 may comprise another vertical cylinder that is deposited adjacent to the ferroelectric layer 1002, in some cases contacting the ferroelectric layer 1002. Finally, the center of each whole may be filled with a second metal 1006 to form the second electrode. The second metal 1006 may be a solid vertical cylinder that fills the center of the cylinder of the barrier layer 1004. For example, vertical electrodes of TiN may be formed using an Atomic Layer Deposition (ALD) process. This process may be used to form a vertical stack of FTJ devices that can be used in various applications, such as a neural network. For example, one FTJ memory device may operate as a synaptic element in a neural network. In some embodiments, this process may be used to form an array of FTJ memory devices in a neural network that store weights for the neural network.

Throughout this disclosure, the term "approximately" may be used to describe values that occur within a range of −15% to +15% of the stated value. For example, a thickness of approximately 100 nm may fall within the range of 85 nm to 115 nm.

In the foregoing description, for the purposes of explanation, numerous specific details were set forth in order to provide a thorough understanding of various embodiments. It will be apparent, however, to one skilled in the art that embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of the example embodiments will provide those skilled in the art with an enabling description for implementing an example embodiment. It should be understood that various changes may be made in the function and arrangement of elements without departing from the spirit and scope of various embodiments as set forth in the appended claims.

Specific details are given in the foregoing description to provide a thorough understanding of the embodiments. However, it will be understood by one of ordinary skill in the art that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

In the foregoing specification, aspects various embodiments are described with reference to specific embodiments, but those skilled in the art will recognize that the invention is not limited thereto. Various features and aspects of the above-described embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

What is claimed is:

1. A ferroelectric tunnel junction (FTJ) memory device, the device comprising:
    a first electrode having first work function;
    a ferroelectric layer comprising ferroelectric dipoles that generates a first electric field, wherein the first electric field is oriented in a first direction when the device operates in an ON state, and the ferroelectric layer is between approximately 7.5 nm and 15.0 nm thick;
    a barrier layer that generates a depolarizing second electric field that is oriented in a second direction opposite of the first direction when the device operates in the ON state, wherein the barrier layer is between approximately 1.0 nm and 2.0 nm thick; and
    a second electrode having a second work function, wherein a difference between the first work function and the second work function generates a third electric field that is oriented in the first direction and that is greater than or equal to the depolarizing second electric field to cancel an effect of the depolarizing second electric field when the device operates in the ON state.

2. The FTJ memory device of claim 1, wherein:
    the ferroelectric layer is between the first electrode and the barrier layer; and
    the barrier layer is between the ferroelectric layer and the second electrode.

3. The FTJ memory device of claim 1, wherein:
    the first electric field is oriented in the second direction when the device operates in an OFF state;
    the depolarizing second electric field is oriented in the first direction when the device operates in the OFF state; and
    the third electric field is oriented in the first direction when the device operates in the OFF state.

4. The FTJ memory device of claim 1, wherein:
    the first electrode comprises a first metal having the first work function; and
    the second electrode comprises a second metal having the second work function, wherein a difference between the first work function and the second work function generates an internal bias creating the third electric field.

5. The FTJ memory device of claim 1, wherein:
    the first electrode comprises a silicon material with a (n+) doping; and
    the second electrode comprises a silicon material with a (p+) doping, wherein a difference in doping levels between the first electrode and the second electrode generates an internal bias creating the third electric field.

6. The FTJ memory device of claim 1, wherein the first electrode is one of a plurality of first electrode layers separated by a plurality of insulator layers in a stack.

7. The FTJ memory device of claim 6, wherein the ferroelectric layer comprises a cylinder that is formed perpendicular to the plurality of first electrode layers and the plurality of insulator layers such that the ferroelectric layer contacts the plurality of first electrode layers.

8. The FTJ memory device of claim 7, wherein the barrier layer comprises a cylinder that is formed adjacent and parallel to the ferroelectric layer to contact the ferroelectric layer.

9. The FTJ memory device of claim 8, wherein the second electrode comprises a cylinder that fills a center of the barrier layer.

10. A method of forming a ferroelectric tunnel junction (FTJ) memory device, the method comprising:
    forming a first electrode having first work function;
    forming a ferroelectric layer comprising ferroelectric dipoles that generate a first electric field, wherein the first electric field is oriented in a first direction when the device operates in an ON state, and the ferroelectric layer is between approximately 7.5 nm and 15.0 nm thick;
    forming a barrier layer that generates a depolarizing second electric field that is oriented in a second direction opposite of the first direction when the device operates in the ON state, wherein the barrier layer is between approximately 1.0 nm and 2.0 nm thick; and
    forming a second electrode having a second work function, wherein a difference between the first work function and the second work function generates a third electric field that is oriented in the first direction and is greater than or equal to the depolarizing second electric field to cancel an effect of the depolarizing second electric field when the device operates in the ON state.

11. The method of claim 10, further comprising determining a ratio of a thickness of the ferroelectric layer to a thickness of the barrier layer, and determining dielectric constants of the barrier layer and the ferroelectric layer.

12. The method of claim 11, further comprising accessing results of a simulation that indicates a work function differential based on the ratio of the thickness ratio, the dielectric constants, and an input ON/OFF ratio.

13. The method of claim 12, wherein a difference between a work function of the first electrode and a work function of the second electrode is approximately equal to the work function differential.

14. The method of claim 10, further comprising assigning one or more current levels between an ON state and an OFF state as memory states of the FTJ memory device.

15. The method of claim 10, further comprising operating the FTJ memory device as a synaptic element in a neural network.

16. The method of claim 10, further comprising connecting the FTJ memory device to an array of FTJ memory devices in a neural network, wherein the FTJ memory device stores weights for the neural network.

17. A ferroelectric tunnel junction (FTJ) memory device, the device comprising:
a first electrode having a first work function;
a ferroelectric layer having a thickness $d_{FE}$ and a dielectric permittivity $k_{FE}$;
a barrier layer having a thickness $d_{IF}$ and a dielectric permittivity $k_{IF}$; and
a second electrode having a second work function, wherein a difference between the first work function and the second work function generates an electric field that is at least $$P_r/k_{FE}\varepsilon_0(1+k_{IF}d_{FE}/k_{FE}d_{IF})^{-1},$$

where $P_r$ represents a remnant polarization, and $\varepsilon_0$ represents a vacuum permittivity.

18. The FTJ memory device of claim 17, wherein the thickness $d_{FE}$ of the ferroelectric layer is approximately 7.5 nm, and the thickness $d_{IF}$ of the barrier layer is selected to cause a depolarizing electric field generated in the barrier layer when the device operates in an ON state to be less than or equal to the electric field generated by the difference between the first work function in the second work function.

19. The FTJ memory device of claim 17, wherein the thickness $d_{FE}$ of the ferroelectric layer is between approximately 7.5 nm and 10.0 nm, and the thickness $d_{IF}$ of the barrier layer is selected to cause a depolarizing electric field generated in the barrier layer when the device operates in an ON state to be less than or equal to the electric field generated by the difference between the first work function in the second work function.

* * * * *